United States Patent [19]
Tomita et al.

[11] Patent Number: 4,834,477
[45] Date of Patent: May 30, 1989

[54] METHOD OF CONTROLLING THE TEMPERATURE OF SEMICONDUCTOR LASER IN AN OPTICAL DEVICE

[75] Inventors: Satoru Tomita; Susumu Imakawa, both of Kanagawa, Japan

[73] Assignee: Ricoh Company, Ltd., Tokyo, Japan

[21] Appl. No.: 843,698

[22] PCT Filed: Jul. 4, 1985

[86] PCT No.: PCT/JP85/00375
§ 371 Date: Mar. 5, 1986
§ 102(e) Date: Mar. 5, 1986

[87] PCT Pub. No.: WO86/00719
PCT Pub. Date: Jan. 30, 1986

[30] Foreign Application Priority Data

Jul. 5, 1984 [JP] Japan ............................ 59-139457
Jul. 11, 1984 [JP] Japan ............................ 59-143922
Jul. 11, 1984 [JP] Japan ............................ 59-143923
Jul. 12, 1984 [JP] Japan ............................ 59-144917

[51] Int. Cl.$^4$ ..................... G02B 26/08; H01S 3/10; H01S 3/04
[52] U.S. Cl. ........................... 350/6.2; 372/9; 372/24; 372/34; 372/38; 372/29; 350/6.1; 350/6.5; 350/6.7

[58] Field of Search ............... 372/9, 15, 16, 24, 34, 372/38, 33, 20, 29; 250/271; 350/6.1, 6.5, 6.7, 6.2

[56] References Cited

U.S. PATENT DOCUMENTS 4,205,350  5/1980  Gunning .......................... 350/6.7
4,338,577  7/1982  Sato et al. ........................ 372/29
4,485,475 11/1984  Large et al. ...................... 372/34
4,505,537  3/1985  Funato ............................ 350/6.7
4,513,422  4/1985  Buholz ............................ 372/24

FOREIGN PATENT DOCUMENTS 34-28066   2/1959  Japan .
39517      4/1981  Japan ............................. 350/6.7
175881    10/1983  Japan ............................. 372/24

OTHER PUBLICATIONS

Webster's Ninth New Collegiate Dictionary, Copyright 1986, p. 319.

Primary Examiner—Eugene R. LaRoche
Assistant Examiner—Michael Shingleton
Attorney, Agent, or Firm—Cooper & Dunham

[57] ABSTRACT

The present invention relates to a method of controlling the temperature of a semiconductor laser in an optical scanning device in which a light beam emitted from the semiconductor laser is deflected by a holographic scanner.

10 Claims, 7 Drawing Sheets (I)

(II)

METHOD OF CONTROLLING THE TEMPERATURE OF SEMICONDUCTOR LASER IN AN OPTICAL DEVICE

BACKGROUND ART

There are known optical scanning devices in which an image can be recorded or read by being scanned with a laser beam. As one of such optical scanning devices, there has been proposed a device employing a semiconductor laser as a light source and a holographic scanner for deflecting a laser beam emitted from the semiconductor laser (see Japanese patent application No. 59-28066, for example).

The optical scanning device of the above type and problems to be solved by the present invention will be described below with reference to FIG. 1.

FIG. 1 shows an image recorder employing an optical scanning device in which a laser beam emitted from a semiconductor laser is deflected by a holographic scanner.

The image recorder includes a semiconductor laser 10, a collimator lens 12, a cylindrical lens 14, plane mirrors 16, 18, 22, a holographic scanner 20, an fθ lens 24, plane mirrors 26, 28, a cylindrical lens 30, a photoconductive photosensitive member 32, and light detectors 34, 36.

Actually, the present invention is embodied in the image recorder shown in FIG. 1. A device similar to the image recorder of FIG. 1, but which lacks the light detector 36, suffers the problems to be solved by the invention. Therefore, insofar as the problems are addressed, the presence of the light detector 36 in FIG. 1 is neglected.

The holographic scanner 20 comprises a hologram disc 20A and a motor 20B. The hologram disc 20A is fixed to the shaft of the motor 20B and driven by the motor 20B to rotate in the direction of the arrow.

A plurality of identically shaped diffraction gratings 200 are arranged in an annular pattern on one surface of a transparent circular base plate of the hologram disc 20A.

The diffraction gratings 200 are linear diffraction gratings and optically equivalent to each other, the diffraction gratings 200 being formed as holograms. The terms "hologram disc" and "holographic scanner" are derived from the fact that the diffraction gratings 200 are formed as holograms.

A laser beam emanating from the semiconductor laser 10 is converted by the collimator lens 12 into a parallel-ray beam, which is passed through the cylindrical lens 14 and reflected by the plane mirrors 16, 18 to fall on the diffraction gratings 200 of the hologram disc 20A, thereby producing a diffraction beam. As the hologram disc 20A rotates, the diffraction beam is deflected since the direction of each of the diffraction gratings 200 varies with respect to the incident laser beam. The diffraction beam as deflected is referred to as a "deflected laser beam".

The diffraction beam is then guided by the plane mirror 22, the fθ lens 24, the plane mirrors 26, 28, and the cylindrical lens 30 to reach the photosensitive member 32 which is in the form of a belt. The diffraction beam is focused as a spot on the photosensitive member 32 by the focusing action of the fθ lens 24 and the cylindrical lenses 14, 30. Upon rotation of the hologram disc 20A, the spot formed on the photosensitive member 32 by the deflected laser beam is linearly displaced on the photosensitive member 32. The spot is cyclically displaced to repeat an optical scanning process each time the laser beam falls on a different diffraction grating. The spot as it scans the photosensitive member follows a straight path 38, which is referred to as a main scanning line. A direction normal to the main scanning line on the photosensitive member 32 is referred to as an auxiliary scanning direction.

The photosensitive member 32 is continuously moved. After the peripheral surface of the photosensitive member 32 has been uniformly charged, it goes to an optical scanning zone in which it is scanned by the deflected laser beam. If the intensity of the laser beam emitted from the semiconductor laser 10 is modified by an image signal representative of an image to be recorded, an electrostatic latent image corresponding to the image to be recorded is formed on the photosensitive member 32. By developing the electrostatic latent image into a visible image, transferring the visible image onto a recording sheet such as of paper, and fixing the image to the sheet, the desired recorded image can be obtained.

The foregoing is an outline of the optical scanning process.

The light detector 24 is employed to detect the deflected laser beam immediately before it scans the photosensitive member 32, so as to align starting points of successive scanning cycles.

As is well known, the wavelength of the laser beam emitted from the semiconductor laser varies as the temperature of the semiconductor laser changes.

In the optical scanning device of the type in which the laser beam from the semiconductor laser is deflected by the holographic scanner, when the wavelength of the laser beam from the semiconductor laser varies, the angle of diffraction of the diffraction beam from the diffraction gratings also varies, and hence the optical scanning zone, i.e., the position of the main scanning line is moved in the auxiliary scanning direction, failing to perform proper optical scanning operation.

The temperature of the semiconductor laser is changed by the temperature of an atmosphere near the semiconductor laser, the Joule heat generated by current passing through the semiconductor laser, etc. In order to stabilize the wavelength of the laser beam, it is necessary to control the temperature of the semiconductor laser. However, it is difficult to directly control the temperature of the semiconductor laser since the semiconductor laser itself is quite small in size. Therefore, it has been customary to indirectly control the temperature of the semiconductor by controlling the temperature of a holder by which the semiconductor is supported.

The semiconductor laser is generally used in a temperature range of from 20° to 50° C. In such a temperature range, the temperature and the wavelength of the laser beam are related generally as indicated by the staircase-like line 3-1 in FIG. 2. The staircase-like line 3-1 is referred to as a characteristic line indicative of the relationship between the temperature and the wavelength. The shape of the characteristic line depends on an individual semiconductor laser and varies from semiconductor laser to semiconductor laser. However, it is generally of a staircase-like shape. As shown in FIG. 2, the characteristic line includes regions such as A, B, C in which the wavelength changes gradually with respect to the temperature change. These regions are referred to as shelf portions, and those between the shelf portions are referred to as step portions in which the wavelength jumps in value. In reality, each of the shelf portions contains more or less irregularities, but such irregularities are neglected as they do not obstruct the optical scanning operation. The width of one shelf portion, i.e., the interval between one step portion and an adjacent step portion, is normally equivalent to a few degrees of temperature. Assuming that the temperature width of the shelf portion B, i.e., the temperature difference $(T_U - T_L)$, is 5 degrees, and a preset temperature $T_0$ is selected intermediate between these temperatures $T_U$, $T_L$, the wavelength of the laser beam emitted from the semiconductor laser can actually be controlled to a constant level by controlling the temperature of the semiconductor laser holder in the vicinity of the preset temperature $T_0$, e.g., in the range of $T_0 \pm 1°$ C.

Even if the temperature of the semiconductor laser varies from $T_L$ to $T_U$, the wavelength of the laser beam varies by a small interval of $\lambda_U - \lambda_L$. Stated otherwise, as long as the temperature of the semiconductor laser varies within one shelf portion, the variation of the main scanning line presents no actual problems.

If the temperature of the semiconductor laser varies beyond $T_U$ or $T_L$, however, the wavelength of the laser beam changes abruptly to a large extent of $(\lambda_2 - \lambda_U)$ or $(\lambda_L - \lambda_1)$. When such a wavelength change occurs, no proper optical scanning operation can be performed.

The problems to be solved by the present invention are as follows:

If the temperature of the semiconductor laser holder is controlled so as to be close to the preset temperature $T_0$, the optical scanning operation will not actually be subject to difficulties arising from variations in the temperature of the semiconductor laser. However, this is based on the premise that the characteristic line remains unchanged with time.

The characteristic line actually does not remain unchanged with time, but changes with time as the semiconductor laser is subjected to fatigue. This time-dependent change takes place in two patterns. In the first pattern, the characteristic line is shifted as a whole toward a lower temperature side aong the shelf portions as indicated by the broken lines in FIG. 3(I). In the second pattern, the characteristic line is shifted as a whole toward a higher temperature side along the shelf portions as indicated by the broken lines in FIG. 3(II).

The time-dependent change of the characteristic line varies from semiconductor laser to semiconductor laser. Some semiconductor lasers have their characteristic lines shifted to the higher or lower temperature side. In other semiconductor lasers, the direction in which the characteristic line is shifted varies with time.

Where the preset temperature for temperature control is $T_0$ in FIG. 3(I), there will be no problem as far as the semiconductor laser is not subjected to fatigue and the characteristic line is as indicated by the solid line 3-1. However, when the characteristic line varies with time toward the broken line 4-1, the wavelength of the emitted laser beam is caused to vary to a large extent even if the temperature of the semiconductor laser is $T_0$. This holds true when the characteristic line varies with time toward the broken line 4-2 in FIG. 3(II).

Once the characteristic line varies with time as described above, the temperature control which has conventionally been practiced is no longer effective.

Therefore, it is a first object of the present invention to provide a temperature control method capable of coping with time-dependent changes of the characteristic line.

A second object of the present invention is to make is possible to effect the temperature control method for an extended period of time.

A third object of the present invention is to make it possible to carry out the temperature control method reliably.

SUMMARY OF THE INVENTION

According to the present invention, the temperature of a semiconductor laser is controlled indirectly through a holder supporting the semiconductor laser.

Specifically, the temperature of the holder is detected by a temperature sensor, and the holder is heated or cooled by a Peltier-effect element dependent on the output signal from the temperature sensor, so that the temperature of the holder is controlled so as to be close to a preset temperature.

Two light detectors are disposed outside of the range which is scanned by a deflected laser beam. The light detectors are so positioned outside of the range that they can detect the deflected laser beam, but will not obstruct the optical scanning process.

The two light detectors are located in order to successively detect the deflected laser beam.

When a main scanning cycle is not effected, the deflected laser beam is detected successively by the two light detectors, and the time difference between the output signals from the light detectors is detected. This time difference varies dependent on the wavelength of the deflected laser beam. When the time difference falls outside of a prescribed range, the preset temperature for temperature control is shifted by a certain temperature and reset.

One of the two light detectors may be used as a beam position detector for detecting a beam position as well as the time difference. With this arrangement, the time-dependent change of the characteristic line can be detected more reliably since the beam position also depends on the wavelength variation. Where appropriate limits are preset for the beam position and the time difference, respectively, the temperature control can be performed more reliably by shifting the preset temperature for temperature control by a certain temperature when one of the beam position and the time difference exceeds its limit. When the preset temperature is reset, the appropriate limits for the beam position and the time difference may also be reset according to the reset temperature, so that the temperature control can be effected properly for a prolonged period of time.

When the main scanning cycle is not effected, the time difference or the time difference and the beam position may be detected while varying the temperature of the semiconductor laser holder, and the temperature may be detected when the time difference or the time difference and the beam position exceed their preset values. A temperature which deviates a certain temperature from the detected temperature may be reset as a preset temperature for temperature control.

Since the time-dependent change of the characteristic line is detected by the time difference between the output signals from the two light detectors or the time difference and the beam position, and the preset temperature for temperature control is shifted according to the detected change, the change of the characteristic line can be coped with in temperature control.

BEST MODE FOR CARRYING OUT THE INVENTION

Embodiments of the present invention will hereinafter be described with reference to the drawings.

Figure 1:
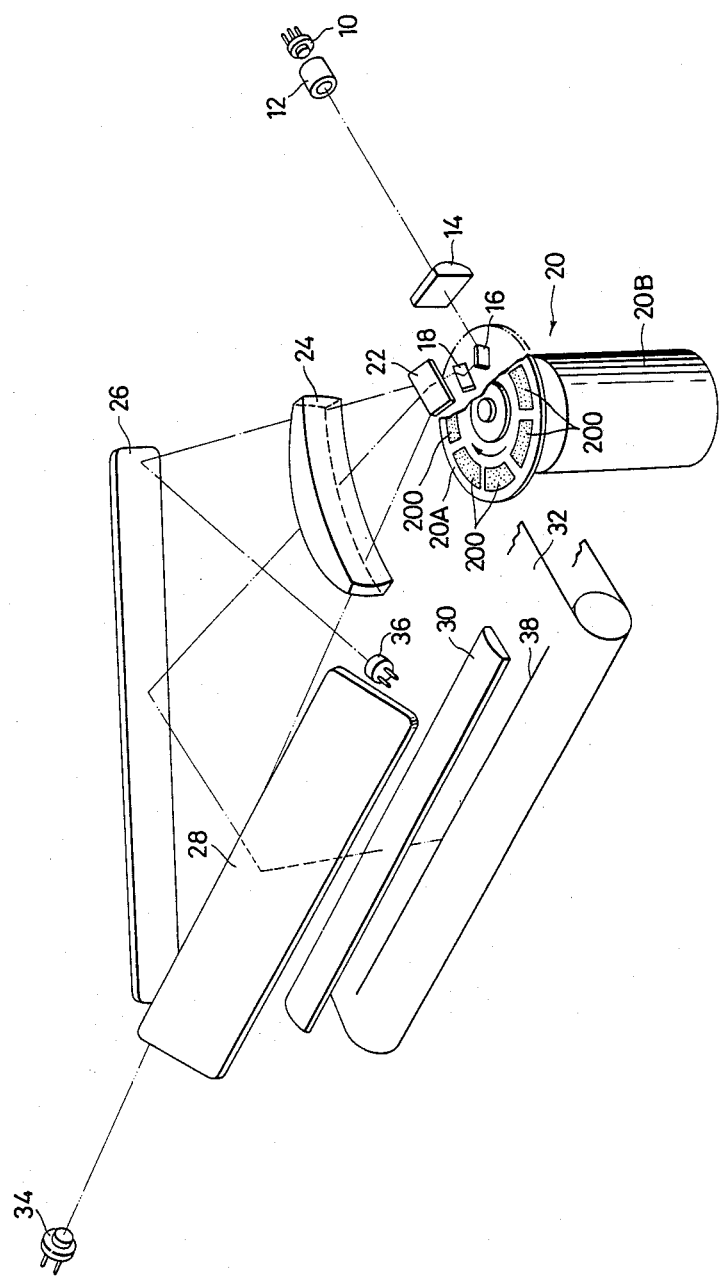
FIG. 1 is a schematic perspective view of an optical scanning device using embodiments of the present invention, the optical scanning device being incorporated in an image recorder.

The present invention is carried out by a device illustrated in FIG. 1.

The light detector 36 which has been neglected in the aforesaid description of the conventional problems is now not neglected and employed as a component required to carry out the present invention.

Therefore, the two light detectors 34, 36 are disposed out of the range which is scanned by the deflected laser beam.

The light detectors are so positioned outside of the range that they can detect the deflected laser beam, but will not obstruct the optical scanning process.

The two light detectors successively detect the deflected laser beam each time the laser beam is deflected. The time difference between the output signals from the two light detectors is detected, and when the detected time difference falls outside of a preset range, the preset temperature for temperature control is shifted by a certain temperature and reset.

As described above, when the wavelength of the laser beam emitted from the semiconductor laser varies, the angle of diffraction of the diffraction beam is also changed. As the angle of diffraction varies, the speed at which the deflected laser beam is scanned is also varied. Therefore, when the deflected laser beam is detected successively by the two light detectors, the time difference between the output signals from the light detectors is varied. Thus, the time difference depends on the variation in the wavelength of the laser beam emitted from the semiconductor laser. The variation in the wavelength of the laser beam from the semiconductor laser is detected by the time difference between the output signals from the two light detectors for temperature control of the semiconductor laser.

The present invention will be described below with reference to a more specific example.

The characteristic line of a semiconductor laser can be known in advance. Although the characteristic line is shifted with time, its shape may be regarded as being not substantially changed.

Figure 2:
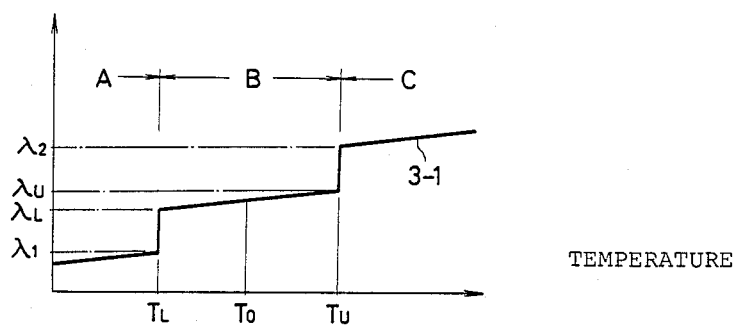
FIGS. 2 and 3 (consisting of parts (I) and (II)) are diagrams explanating the characteristic line of a semiconductor laser and time-dependent changes thereof.
Figure 3:
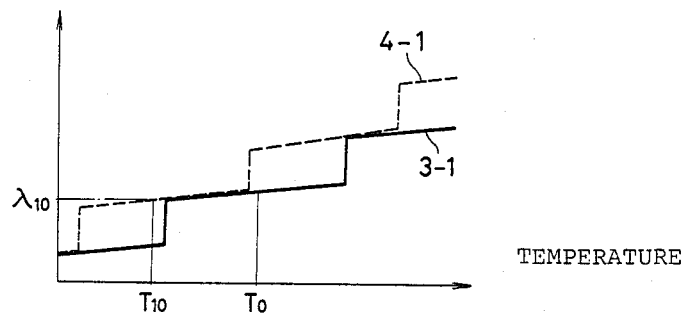
Figure 3:
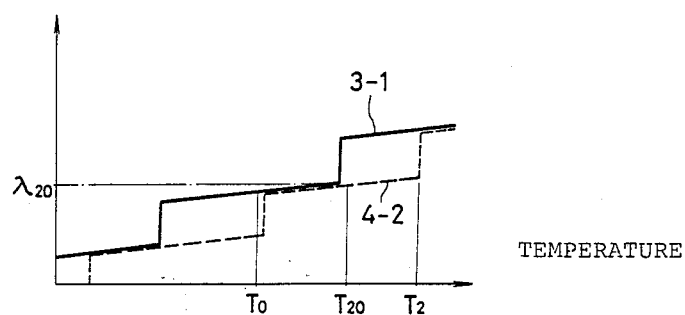

It is assumed that the characteristic line of the semiconductor laser 10 shown in FIG. 1 is indicated by the line 3-1 in FIGS. 2 and 3 when the semiconductor laser 10 is not subjected to fatigue. It is also assumed that when the semiconductor laser 10 is not subjected to fatigue, the preset temperature for temperature control is $T_0$ and the wavelength of the laser beam at such temperature is $\lambda_0$. The deflected laser beam is detected by the two light detectors 34, 36. Each time the laser beam is deflected, the deflected laser beam is first detected by the light detector 34, scans the photosensitive member 32, and then is detected by the light detector 36. At the wavelength $\lambda_0$, the time difference between the output signals from the light detectors 34, 36 is indicated by $\tau_0$.

Waveforms at $\lambda_0+(\lambda_2-\lambda_U)=\lambda_A$, $\lambda_0-(\lambda_L-\lambda_1)=\lambda_B$ are established, and the time differences between the output signals from the light detectors 34, 36 at the wavelengths $\lambda_A$, $\lambda_B$ are indicated by $\tau_A$, $\tau_B$, respectively. Since $\lambda_A > \lambda_0 > \lambda_B$, and also since the angle of diffraction becomes greater as the wavelength is longer and the time difference becomes shorter as the angle of diffraction is larger, $\tau_A < \tau_0 < \tau_B$.

The time difference between the output signals from the light detectors 34, 36 is now detected. Considering that the preset temperature for temperature control is $T_0$, when the time difference $\tau_A$ is detected, the characteristic line of the semiconductor laser 10 is as indicated by the line 4-1 in FIG. 3(I). Therefore, by setting the preset temperature for temperature control as $T_{10}$ which is deviated from $T_0$ by a temperature (about ½ ($T_U-T_L$) toward a lower temperature side and then effecting temperature control, the preset temperature is now positioned near the center of the shelf portion B of the characteristic line 4-1 of the semiconductor laser which is subjected to fatigue, and the wavelength of the emitted laser beam is stabilized closely to $\lambda_{10}$ which is near the original wavelength $\lambda_0$. Likewise, when the time difference $\tau_B$ is detected, the characteristic line is as indicated by the line 4-2 in FIG. 3(II). The preset temperature is shifted from $T_0$ a certain temperature toward a higher temperature side and reset as $T_{20}$. The wavelength of the emitted laser beam is now stabilized closely to $\lambda_{20}$ near the original wavelength $\lambda_0$ through temperature control.

Figure 4:
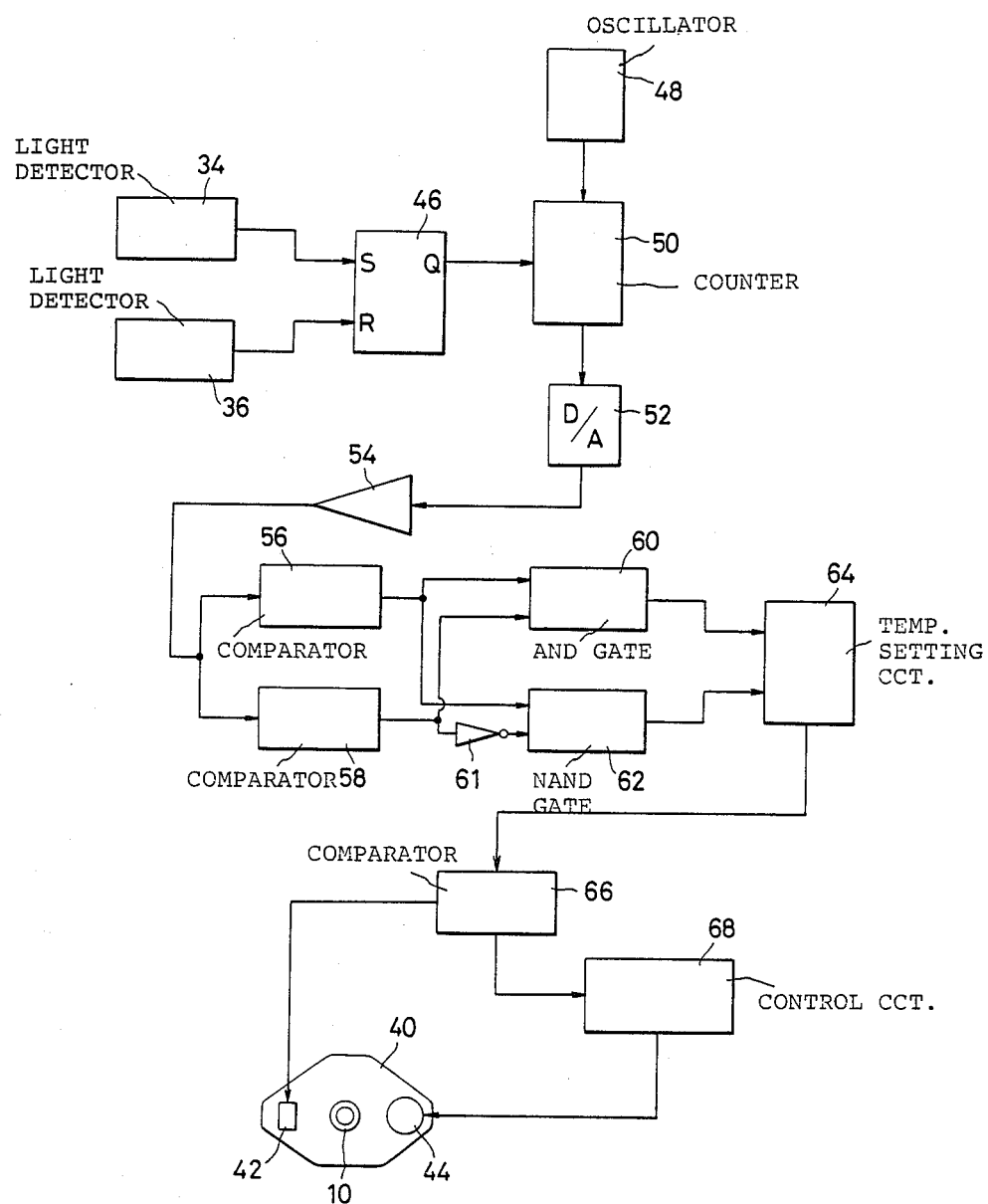
FIG. 4 is a block diagram of a circuit arrangement used for carrying out the present invention.

FIG. 4 shows in block form a circuit arrangement for carrying out the present invention.

The semiconductor laser 10 is supported on a holder 40. The temperature of the holder 40 is detected by a thermistor 42 serving as a temperature sensor. The holder 40 can be heated or cooled by a Peltier-effect element 44.

During an initial period in which the semiconductor laser 10 is not fatigued, a value corresponding to the temperature $T_0$ is preset in a comparator 66. The output signal from the thermistor 42 is applied to the comparator 66 and compared with the preset value. An output commensurate with the difference between the compared values is fed from the comparator 66 to a control circuit 68. The control circuit 68 is responsive to the applied signal to control the operation of the Peltier-effect element 44 for heating or cooling the holder 40 so that the output signal from the thermistor 42 will be brought into accord with the preset value in the comparator 66. Therefore, during the initial period, the temperature of the holder 40 is controlled so as to be close to the preset value $T_0$, and the temperature of the semiconductor laser 10 is also controlled indirectly so as to be close to $T_0$.

The output signals from the light detectors 34, 36 are converted to voltage signals and amplified, and then applied to a flip-flop 46. The output signal from the flip-flop 46 thus depends on the time difference between the output signals of the light detectors 34, 36. The output signal from the flip-flop 46 is then applied to a counter 50 and measured by clock pulses from an oscillator 48. The measured result is converted to an analog value by a D/A converter 52. The analog signal is then amplified by an amplifier 54 and applied to comparators 56, 58.

The comparator 56 issues a logic 0 when the time difference $\tau$ between the output signals from the light detectors 34, 36 is larger than the preset value $\tau_B$, and issues a logic 1 when the time difference $\tau$ is smaller than the preset value $\tau_B$. The comparator 58 issues a logic 0 when the time difference $\tau$ is smallr than $\tau_A$ and issues a logic 1 when the time difference $\tau$ is larger than $\tau_A$.

The output signal from the comparator 56 is applied to an AND gate 60 and a NAND gate 62, and the output signal from the comparator 58 is applied to the AND gate 60 and also to the NAND gate 62 through an inverter 61.

When $\tau_A < \tau < \tau_B$, the output signals from the AND gate 60 and the NAND gate 62 are a logic 1. When $\tau > \tau_B$, the output signal from the AND gate 60 is a logic 0, and the output signal from the NAND gate 62 is a logic 1. When $\tau < \tau_A$, the output signals from the AND gate 60 and the NAND gate 62 are a logic 0.

Therefore, different signals are applied to a temperature setting circuit 64 respectively when $\tau_A < \tau < \tau_B$, $\tau > \tau_B$, and $\tau < \tau_A$.

When $\tau_A < \tau < \tau_B$, the temperature setting circuit 64 maintains as the preset temperature the preset value in the comparator 66 at that time. When $\tau > \tau_B$, the temperature setting circuit 64 resets the preset temperature in the comparator 66 to a value corresponding to a temperature which deviates toward a lower temperature side by a certain temperature, for example, $\frac{1}{2}(T_U - T_L)$. When $\tau < \tau_A$, the temperature setting circuit 64 resets the preset temperature to a value corresponding to a temperature which deviates toward a higher temperature side by a certain temperature.

The time difference between the output signals from the light detectors 34, 36 is detected and the preset temperature is changed according to the detected time difference when a main scanning cycle is not effected, i.e., when the semiconductor laser is energized, the holographic scanner is operated, and optical scanning for recording or reading an image is not performed.

The light detector 34 shown in FIG. 1 doubles as a synchronism detector for synchronizing the optical scanning cycles. The two light detectors may be positioned anywhere outside of the scanning zone provided they can successively detect the deflected laser beam.

Another embodiment is also carried out by a device illustrated in FIG. 1.

In this embodiment, when a main scanning cycle is not effected, the time difference between the output signals from the two light detectors is detected while varying the temperature of the holder. The holder temperature is detected when the detected time difference exceeds a preset value. A temperature which deviates from the detected temperature by a certain temperature is set as a preset temperature for temperature control. When a main scanning cycle is not effected, the semiconductor laser is energized, the holographic scanner is operated, and optical scanning (main scanning cycle) for recording or reading an image is not performed. Specifically, a time when no main scanning cycle is effected is between main scanning cycles or during a standby period before a main scanning cycle.

The two light detectors in the arrangement of FIG. 1 are the light detectors 34, 36, respectively. The deflected laser beam is detected by the light detector 34 immediately before it scans the scanning zone and then is detected by the light detector 36 after it has scanned the scanning zone. The output signal from the light detector 34 is employed to synchronize optical scanning cycles. Therefore, the light detector 34 in FIG. 1 according to this embodiment serves to control the temperature and also to perform synchronization of optical scanning cycles.

As described above, when the temperature of the semiconductor laser varies to change the wavelength of the emitted laser beam, the angle of diffraction of the beam diffracted by the diffraction gratings of the hologram disc is also varied. The variation in the angle of diffraction results in a change in the speed at which the laser beam is deflected. Therefore, a variation in the time difference between two output signals from the light detectors located at respective positions in a zone in which the laser beam is deflected corresponds to a variation in the wavelength of the laser beam emitted by the semiconductor laser. The present invention is based on this fact.

The embodiment will hereinafter be described in specific detail. It is assumed that the characteristic line of the semiconductor laser 10 shown in FIG. 1 at the time it is free of fatigue is as indicated by the line 3-1 in FIG. 2. The characteristic line varies with time. Strictly speaking, the shape of the characteristic line also varies with time. However, such a variation in the shape of the characteristic line is quite small, and the shape of the characteristic line may be regarded as unchanged in carrying out the invention.

A preset temperature for temperature control is now established at the center of the shelf portion B of the characteristic line 3-1. Since the shape of the characteristic line 3-1 remains substantially unchanged with time, the temperature difference $(T_U - T_L)$ between temperatures $T_L$, $T_U$ at the step portions at the ends of the shelf portion B also remains unchanged although the temperatures $T_L$, $T_U$ themselves vary with time. $\frac{1}{2}(T_U - T_L)$ will hereinafter be referred to as $\Delta T$.

Figure 5:
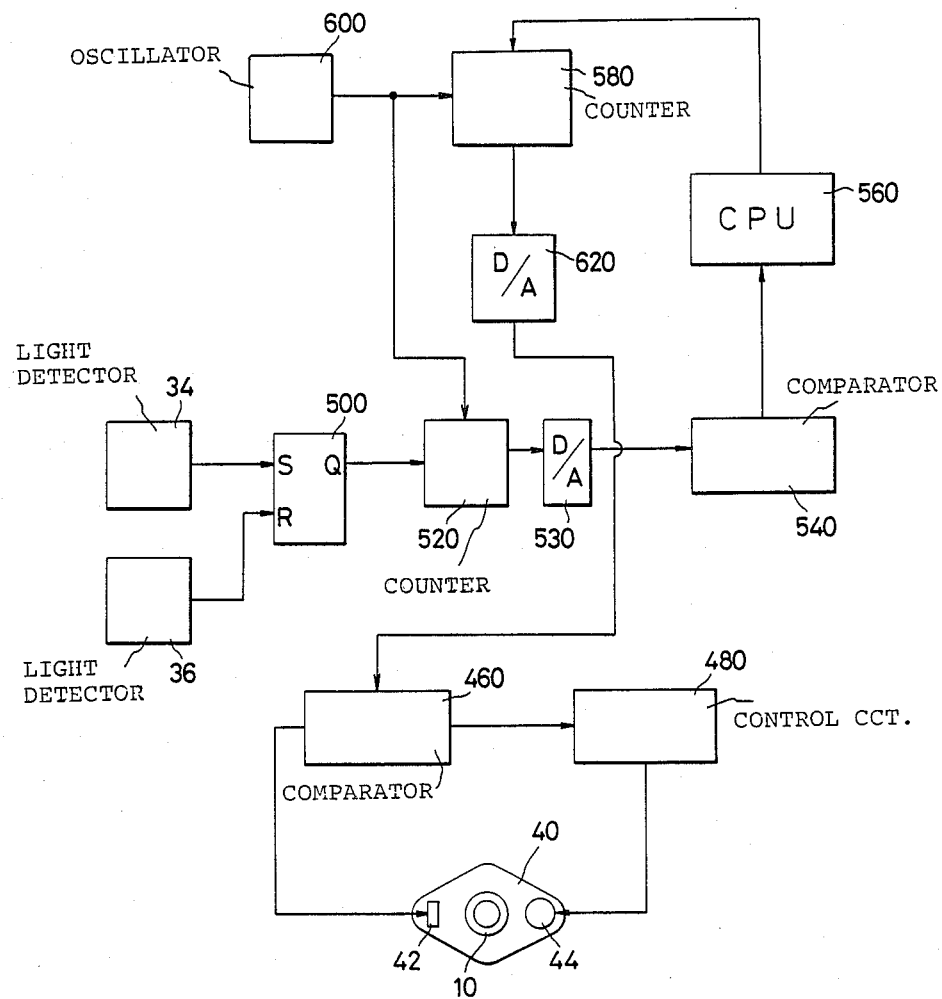
FIG. 5 is a block diagram of another circuit arrangement used for carrying out the present invention.

Temperature control of the semiconductor laser 10 during a main scanning cycle is effected as follows:

In FIG. 5, a comparison level corresponding to the preset temperature such as a temperature $T_0$ for example is set in a comparator 460. This temperature setting is referred to as setting of the temperature $T_0$ for temperature control.

The temperature of the holder 40 is detected by the thermistor 42. The output signal from the thermistor 42 is applied to the comparator 460, in which it is compared with the comparison level. The comparator 460 then applies a signal indicative of the difference between the compared signals to a control circuit 480, which controls a current flowing through the Peltier-effect element 44 according to the applied signal. The Peltier-effect element 44 produces or absorbs heat dependent on the magnitude and direction of the current flowing therethrough to heat or cool the holder 40. The Peltier-effect element 44 is controlled such that the output signal from the thermistor 42 will be equalized to the comparison level in the comparator 46. Thus, the temperature of the holder 40 is controlled so as to be close to the preset temperature, and so is the temperature of the semiconductor laser 10.

If the temperature control of the invention is performed when a main scanning cycle is not effected, a CPU 560 energizes a counter 580. The counter 580 counts clock pulses generated from an oscillation 600 and increments its output signal successively and slowly from a given initial value in a staircase patttern each time a prescribed number of pulses are counted. The output signal from the counter 580 is converted by a D/A converter 620 to an analog signal which is applied to the comparator 460 to change the comparison level in the comparator 460. Therefore, the comparison level in the comparator 460 is varied in a step-like manner from a given initial level, which corresponds to $T_0$ in FIG. 3(II), for example. One step of the staircase pattern of the comparison levels corresponds to a temperature difference of 0.1 degree, for example. As a consequence, the preset temperature for temperature control varies from $T_0$ in a step-like manner by increments of 0.1° C. The temperature of the semiconductor laser 10 is therefore increased through the holder 40 from $T_0$ by increments of 0.1° C. The preset temperature in the comparator 460 is slowly changed in order to enable the temperatures of the holder 40 and the semiconductor laser 10 to follow, without fail, the preset temperature as it changes. The preset temperature should thus be varied slowly but as quickly as the temperatures of the holder 40 and the semiconductor laser 10 can follow the preset temperature.

The output signals from the light detectors 34, 36 are applied to a flip-flop 500, which then produces an output signal commensurate with the time difference between the output signals of the light detectors 34, 36. The output signal from the flip-flop 500 is counted by a counter 520 using the clock pulses from the oscillator 600. The count of the counter 520 is converted by a D/A converter 530 to an analog signal, which is applied to a comparator 540.

It is assumed with respect to the characteristic line 3-1 that a wavelength of the laser beam corresponding to the temperature $T_0$ is $\lambda_0$, the time difference between the output signals from the light detectors 34, 36 at a wavelength of $\lambda_0 + (\lambda_2 - \lambda_U)$ is $t_M$, which is selected as a preset value, and a value corresponding to $t_M$ is set in the comparator 540.

The angle of diffraction of the diffraction beam is larger as the wavelength is longer, and the speed at which the laser beam is deflected is higher as the angle of diffraction is larger. Therefore, the longer the wavelength the smaller the time difference between the output signals from the light detectors.

The comparator 540 is arranged so that it produces an output signal when an input level applied to the comparator 640 is reduced below the comparison level therein, i.e., when the time difference t between the light detector outputs is smaller than $t_M$.

The comparator 540 then issues an output signal when the temperature T of the semiconductor laser is $T_U$ (FIG. 2) as far as the characteristic line is indicated by 3-1. As far as the characteristic line is indicated by 4-1, the comparator 540 issues an output signal when the temperature T is $T_0$ (FIG. 3(I)). As far as the characteristic line is indicated by 4-2, the comparator 540 issues an output signal when the temperature T is $T_2$ (FIG. 3(II)). At any rate, the temperature of the semiconductor laser 10 when the comparator 540 produces an output signal is a temperature at the step portion on the higher-temperature side of the shelf portion B. Therefore, by setting the preset temperature for temperature control which deviates $\Delta T_T = \frac{1}{2}(T_U - T_L)$ toward a lower temperature side from the temperature at the time the comparator 540 issues an output signal, the temperature of the semiconductor laser 10 can always be controlled to a temperature close to the center of the shelf portion B.

It is now assumed that the temperature at the time the comparator 540 produces an output signal is $T_U$. When the comparator 540 produces an output signal, the CPU 560 responds to it and energizes the counter 580 to count down the clock signals by a count corresponding to the temperature $\Delta T$. Thereafter, the CPU 560 de-energizes the counter 580.

The comparison level applied to the comparator 460 is then set to a value corresponding to $T_U - \Delta T = T_0$. The temperature of the semiconductor laser 10 is thereafter controlled to achieve the preset temperature $T_0$.

When the temperature of the semiconductor laser 10 at the time the comparator 540 issues an output signal is $T_0$ or $T_2$, the preset temperature for temperature control is set to $T_0 - \Delta T$ (FIG. 3(I)) or $T_2 - \Delta T$ (FIG. 3(II)).

Therefore, the preset temperature for temperature control varies as the characteristic line varies with time, and the wavelength of the laser beam emitted from the semiconductor laser also varies with the preset temperature. Since the wavelength of the emitted laser beam varies to a small extent, optical scanning cycles can be carried out stably at all times.

A third embodiment is also carried out by the device shown in FIG. 1.

In this embodiment, when a main scanning cycle is not performed, i.e., when the semiconductor laser is energized, the holographic scanner is in operation, and an optical scanning cycle (main scanning cycle) is not effected to record or read an image, specifically, between adjacent main scanning cycles or during a standby period prior to the initiation of a main scanning cycle, the beam position of the deflected laser beam is detected by a beam position detector, and the time difference between the output signals from the beam position detector and a light detector is detected.

There are established proper ranges respectively from the beam position and the time difference.

When at least one of the beam position and the time difference, as detected, exceeds a limit of the corresponding proper range, the preset temperature for temperature control is shifted a certain temperature from the previous temperature and reset, and the limits of the beam position and time difference ranges are reset according to the preset temperature which has thus been reset.

The present embodiment will now be described specifically.

Figure 6:
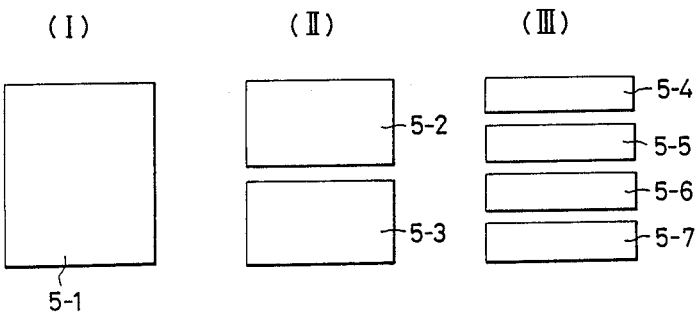
FIGS. 6 (consisting of parts (I), (II) and (III)) and 7 are views explanatory of a beam position detector used in the present invention.

The beam position detector may comprise a semiconductor position detector of a conventional design. Various such semiconductor position detectors are known. For example, such a semiconductor position detector has a single light detecting surface 5-1 as shown in FIG. 6(I). Another semiconductor position detector has two light detecting surfaces 5-2, 5-3 as illustrated in FIG. 6(II). Still another semiconductor position detector has four light detecting surfaces 5-4, 5-5, 5-6, 5-7 as shown in FIG. 6(III). The above various semiconductor position detectors may appropriately be employed as the beam position detector of the present embodiment. In the following description, the semiconductor position detector with the single light detecting surface 5-1 as shown in FIG. 6(I) will be employed by way of example.

Figure 7:
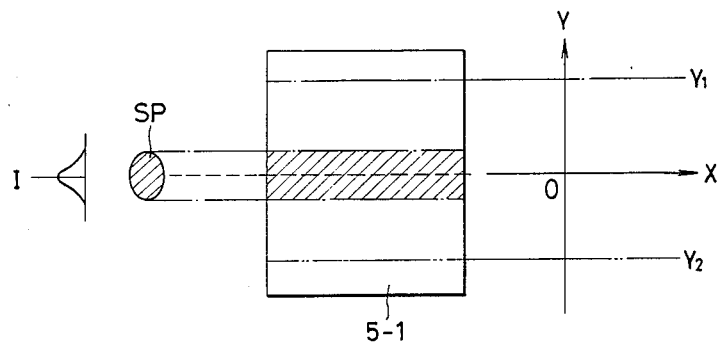

As shown in FIG. 7, the deflected laser beam detected by the light detecting surface 5-1 forms a laser beam spot SP. The spot SP has an intensity I having a bell-shaped distribution as shown on the lefthand side of FIG. 7. As the spot SP traverses the light detecting surface 5-1 in the direction of the arrow X, the beam position detector produces an output signal, which varies dependent on the position in which the center of the spot SP traverses the Y-axis. Therefore, the position on the Y-axis in which the spot SP traverses the Y-axis can be known from the output signal from the beam position detector.

As described above, when the wavelength of the laser beam emitted from the semiconductor laser varies, the angle of diffraction of the laser beam is also changed. As the angle of diffraction varies, the position of the deflected laser beam varies in a direction corresponding to the auxiliary scanning direction.

By aligning the Y direction of the light detecting surface 5-1 of the beam position detector with the auxiliary scanning direction, a variation in the wavelength of the laser beam emitted by the semiconductor laser can be determined from the output signal from the beam position detector.

It is assumed for the purpose of specifically describing the embodiment that the characteristic line of the semiconductor laser which is not subjected to fatigue is as indicated by 3-1 (FIGS. 2 and 3) and the initial preset temperature for temperature control is $T_0$ (at this time, the wavelength of the emitted laser beam is $\lambda_0$). The temperature of the semiconductor laser is controlled so as to be close to the temperature $T_0$ through temperature control of the holder.

It is also assumed that when the characteristic line varies with time to the line 4-1 shown in FIG. 3(I) during temperature control, the beam position is shifted above a position $Y_1$ in FIG. 7, and when the characteristic line varies with time to the line 4-1 shown in FIG. 3(II) during temperature control, the beam position is shifted below a position $Y_2$ in FIG. 7.

The interval between the positions $Y_1$, $Y_2$ is defined as a proper range with its limits being $Y_1$, $Y_2$. The characteristic line can be identified as the line 4-1 or the line 4-2 by ascertaining whether the beam position exceeds the limit $Y_1$ or $Y_2$. If the characteristic line is shifted to the line 4-1 or 4-2, the wavelength of the emitted laser beam is largely shifted from the initial value $\lambda_0$ by $(\lambda_2 - \lambda_U)$ or $(\lambda_L - \lambda_1)$ even when the temperature of the semiconductor laser is controlled to $T_0$, and no correct optical scanning operation can be performed. When this happens, the preset temperature for temperature control is shifted from $T_0$ toward a lower or higher temperature side by a given temperature $\Delta T = \frac{1}{2}(T_U - T_L)$ dependent on whether the characteristic line is 4-1 or 4-2. By thus resetting the preset temperature to $T_{10}$ or $T_{20}$, the wavelength of the laser beam is stabilized at $\lambda_{10}$ or $\lambda_{20}$ close to the initial value $\lambda_0$, and the proper optical scanning operation is made possible again. In order to repeat such temperature control, the limits of the proper range are reset according to the new preset temperature so that the step portions at the ends of the shelf portion used on the characteristic line can be detected with the new preset temperature $T_{10}$ or $T_{20}$.

As the wavelength of the laser beam emitted from the semiconductor laser varies, the angle of diffraction of the laser beam is also changed, and so is the speed of deflection of the laser beam. Therefore, if the deflected laser beam is detected successively by the beam position detector and the light detector, and the time difference $\tau$ between the output signals from the beam position detector and the light detector is detected, such time difference $\tau$ also varies with the laser beam wavelength. Thus, a proper range can also be established for the time difference $\tau$. More specifically, assuming that the time difference at the laser beam wavelength $\lambda_0$ is $\tau_0$, and that when the characteristic line is indicated by 4-1 at the temperature $T_0$, the time difference $\tau$ is reduced below a limit $\tau_1$ of the proper range, and when the characteristic line is indicated by 4-2 at the temperature $T_0$, the time difference $\tau$ is increased beyond a limit $\tau_2$ of the proper range, the characteristic line can be identified by ascertaining whether the time difference $\tau$ exceeds the limit $\tau_1$ or $\tau_2$. Therefore, the preset temperature for temperature control can be reset from $T_0$ to $T_0 + \Delta T$ or $T_0 - \Delta T$. With such an arrangement, the above control can be repeated by resetting the limits $\tau_1$, $\tau_2$ of the proper range of the time difference $\tau$ to new values.

According to this embodiment, the time-dependent change of the characteristic line is detected simultaneously by two parameters, i.e., the beam position and the time difference, and the preset temperature and the limits of the proper ranges of the parameters are reset when at least one of the parameters exceeds a limit of its proper range.

The embodiment will hereinafter be described more specifically.

In harmony with the description of the preceding embodiment, it is assumed that the characteristic line of the semiconductor laser free of fatigue is indicated by the line 3-1 (FIGS. 2 and 3), the preset temperature for temperature control is initially $T_0$, and the laser beam wavelength at that time is $\tau_0$.

The beam position detector 34 has a single light detecting surface as shown in FIG. 7 with the beam position indicated by Y. The time difference between the output signals from the beam position detector 34 and the light detector 36 is indicated by T. The limits of the initial proper ranges for the beam position Y and the time difference $\tau$ are indicated by $Y_1$, $Y_2$, $\tau_1$, $\tau_2$. The limits $Y_1$, $\tau_1$ are values taken when a laser beam having a wavelength of $\lambda_0 + (\lambda_2 - \lambda_0)$ is scanned, and the limits $Y_2$, $\tau_2$ are values taken when a laser beam having a wavelength of $\lambda_0 + (\lambda_L - \lambda_1)$ is scanned. It is also assumed that $\Delta T = \frac{1}{2}(T_U - T_L)$.

Temperature control in a main scanning cycle will be described with reference to FIG. 8(I). The preset temperature is electrically set in a comparator 4800 by a microcomputer 4600. The temperature of the holder 40 is detected by the thermistor 42, and compared with the preset temperature by the comparator 4800. The comparator 4800 produces an output signal commensurate with the difference between the temperature of the holder 40 and the preset temperature. The output signal from the comparator 4800 is applied to a control circuit 5000 and the microcomputer 4600.

In response to the output signal from the comparator 4800, the control circuit 5000 controls the Peltier-effect element 44 to heat or cool the holder 40 so that the temperature of the holder 40 approaches the preset temperature.

Figure 8:
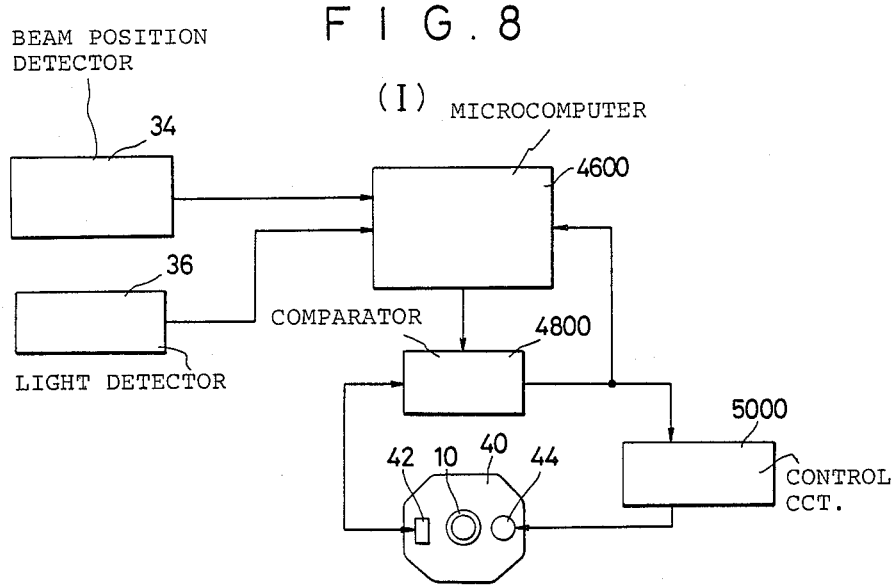
FIGS. 8 (consisting of parts (I) and (II)) and 9 are circuit diagrams explanating temperature control means in the present invention.
Figure 8:
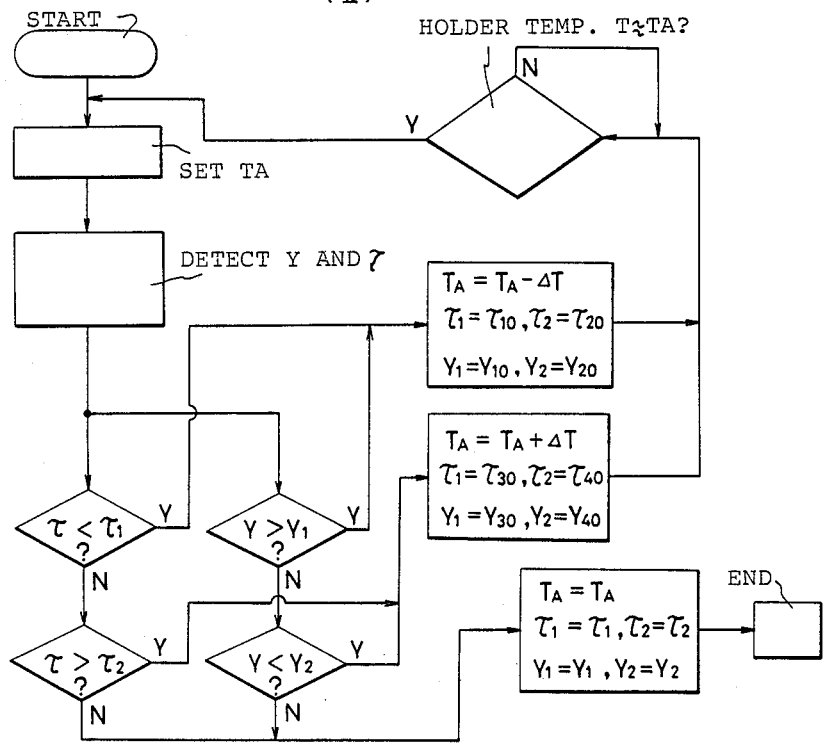

Temperature control according to the present embodiment will be described with reference to FIG. 8(II).

When the temperature control process is started at the time a main scanning cycle is not effected, the output signals from the beam position detector 34 and the light detector 36 are applied to the microcomputer 4600. The microcomputer 4600 then processes the applied signals to detect the beam position Y and the time difference $\tau$. At this time, a preset temperature $T_A$ is set in the comparator 4800, the preset temperature $T_A$ being initially $T_0$. First, operation when $T_A = T_0$ will be described.

The detected Y, $\tau$ are compared with the limits $Y_1$, $Y_2$, $\tau_1$, $\tau_2$ of the proper ranges. If $Y_1 > Y > Y_2$ and $\tau_2 > \tau > \tau_1$, then the laser beam wavelength is near $\lambda_0$, and the preset temperature is not required to be changed. The preset temperature $T_A$ and the limits $\tau_1$, $\tau_2$, $Y_1$, $Y_2$ remain the same, and the control process is completed.

If $\tau < \tau_1$ and/or $Y > Y_1$, however, the characteristic line is shifted to the line 4-1 shown in FIG. 3(I). Then, the preset temperature $T_A$ is shifted $\Delta T$ toward a lower temperature side and reset, and the limits $\tau_1$, $\tau_2$ $Y_1$, $Y_2$ are changed to $\tau_{10}$, $\tau_{20}$, $Y_{10}$, $Y_{20}$, accordingly. As a result, the preset temperature $T_A$ becomes $T_{10}$ shown in FIG. 3(I). The limits $\tau_{10}$, $Y_{10}$ are set to values taken when a laser beam having a wavelength of $\lambda_{10} + (\lambda_2 - \lambda_U)$ is scanned and the limits $\tau_{20}$, $Y_{20}$ are set to values taken when a laser beam having a wavelength of $\lambda_{10} = (\lambda_L - \lambda_1)$ is scanned.

The temperature of the holder 40 is now controlled with the new preset temperature $T_{10}$. The microcomputer 4600 detects, with the output signal from the comparator 4800, whether the temperature of the holder 40 has sufficiently approached the preset temperature $T_{10}$. If the holder temperature is close enough to the preset temperature $T_{10}$, then the beam position Y and the time difference $\tau$ are detected once again. When the temperature control is effected properly, the detected Y, $\tau$ are in the ranges: $Y_1 > Y > Y_2$ and $\tau_2 > \tau > \tau_1$ with respect to the newly set limits $\tau_1$, $\tau_2$, $Y_1$, $Y_2$. The control process is then brought to an end, and the preset temperature $T_A$ and the limits $\tau_1$, $\tau_2$, $Y_1$, $Y_2$ remain fixed until a next control process is carried out.

If $\tau > \tau_2$ or $Y < Y_2$, the characteristic line is shifted to the line 4-2 shown in FIG. 3(II). Then, the preset temperature $T_A$ is shifted $\Delta T$ toward a higher temperature side and reset to $T_{20}$, and the limits $\tau_1$, $\tau_2$ $Y_1$, $Y_2$ are changed to $\tau_{30}$, $\tau_{40}$, $Y_{30}$, $Y_{40}$. The limits $\tau_{30}$, $Y_{30}$ are set to values taken when a laser beam having a wavelength of $\lambda_{20} + (\lambda_2 - \lambda_U)$ is scanned, and the limits $\tau_{40}$, $Y_{40}$ are set to values taken when a laser beam having a wavelength of $\lambda_{20} - (\lambda_L - \lambda_1)$ is scanned. The subsequent process is the same as described above. Since a change in the characteristic line can be detected through the two parameters in the above manner, erroneous operation can be prevented.

A fourth embodiment corresponding to the invention will be described below.

In this embodiment, when a main scanning cycle is not effected, i.e., when the semiconductor laser is energized, the holographic scanner is in operation, and an optical scanning cycle (main scanning cycle) is not effected to record or read an image, the temperature of the semiconductor laser holder is changed, and at the same time the beam position of the deflected laser beam is detected by the beam position detector, and simultaneously the time difference between the output signals from the beam position detector and the light detector is detected.

There are established limits respectively for the beam position and the time difference. The holder temperature when at least one of the beam position and the time difference, as detected, exceeds a limit thereof is detected, and a temperature deviating a certain temperature from the holder temperature is set as the preset temperature for temperature control.

The beam position detector may comprise a semiconductor position detector of a conventional design. Various such semiconductor position detectors are known. For example, such a semiconductor position detector has a single light detecting surface 5-1 as shown in FIG. 6(I). Another semiconductor position detector has two light detecting surfaces 5-2, 5-3 as illustrated in FIG. 6(II). Still another semiconductor position detector has four light detecting surfaces 5-4, 5-5, 5-6, 5-7 as shown in FIG. 6(III). The above various semiconductor position detectors may appropriately be employed as the beam position detector of the present embodiment. In the following description, the semiconductor position detector with the single light detecting surface 5-1 as shown in FIG. 6(I) will be employed by way of example.

As shown in FIG. 7, the deflected laser beam detected by the light detecting surface 5-1 forms a laser beam spot SP. The spot SP has an intensity I having a bell-shaped distribution as shown on the lefthand side of FIG. 7. As the spot SP traverses the light detecting surface 5-1 in the direction of the arrow X, the beam position detector produces an output signal, which varies dependent on the position in which the center of the spot SP traverses the Y-axis. Therefore, the position on the Y-axis in which the spot SP traverses the Y-axis can be known from the output signal from the beam position detector.

As described above, when the wavelength of the laser beam emitted from the semiconductor laser varies, the angle of diffraction of the laser beam is also changed. As the angle of diffraction varies, the position of the deflected laser beam varies in a direction corresponding to the auxiliary scanning direction.

By aligning the Y direction of the light detecting surface 5-1 of the beam position detector with the auxiliary scanning direction, a variation in the wavelength of the laser beam emitted by the semiconductor laser can be determined from the output signal from the beam position detector.

It is assumed for the purpose of specifically describing the embodiment that the characteristic line of the semiconductor laser which is not subjected to fatigue is as indicated by 3-1 (FIGS. 2 and 3) and the wavelength of the laser beam emitted from the semiconductor laser at the temperature $T_0$ is $\lambda_0$ on the characteristic line 3-1.

A wavelength of $\lambda_0 + (\lambda_2 - \lambda_U)$ will be considered for example. The beam position at the time of optically scanning the laser beam of the wavelength of $\lambda_0$ is aligned with the point 0 on the Y-axis in FIG. 7. It is assumed that the beam position at the time of optically scanning the laser beam of the wavelength of $\lambda_0 + (\lambda_2 - \lambda_U)$ is indicated by $Y_1$ in FIG. 7, and as the wavelength grows longer, the beam position is shifted upwardly in FIG. 7 until its Y coordinate becomes $Y > Y_1$.

When a main scanning cycle is not performed, e.g, between adjacent main scanning cycles or during a standby period prior to the initiation of a main scanning cycle, the temperature of the holder is gradually from the initial temperature $T_0 (<T_L)$ at such a rate that the increasing temperature of the semiconductor laser can reliably follow the increasing temperature of the holder. The temperature may be increased continuously or in small increments of 0.1 degree, for example, in a step-like pattern.

As the temperature rises, the wavelength of the laser beam emitted from the semiconductor laser becomes progressively longer. The beam position Y is also progressively increased until it exceeds the limit $Y_1$. When the beam position Y exceeds the limit $Y_1$, the temperature of the semiconductor laser is $T_U$ for the characteristic line 3-1, $T_0$ for the characteristic line 4-1, and $T_2$ for the characteristic line 4-2. On each characteristic line, the temperature of the semiconductor laser corresponds to a temperature at the step portion on the higher temperature side of the shelf portion B. It is assumed in FIG. 2 that the shelf portions A, B, C on the characteristic line 3-1 stay therewith as the characteristic line varies with time.

The beam position $Y_1$ serves as a mark for detecting the step portion on the higher temperature side of the shelf portion B. The mark for detecting a desired step portion of a certain shelf portion is called a limit. The mark $Y_1$ is one example of a limit for a beam position.

The temperature when the beam position Y exceeds the limit $Y_1$ is indicated by $T_B$. The temperature $T_B$ corresponds to a temperature at the step portion on the higher temperature side of the shelf portion B. By setting $T_B - \Delta T$ as a preset temperature for temperature control, which deviates from the temperature $T_B$ toward a lower temperature side by $\Delta T = \frac{1}{2}(T_U - T_L)$, the temperature of the semiconductor laser can be controlled with respect to the center of the shelf portion B at all times irrespectively of how the characteristic line varies with time, so that the laser beam wavelength can be stabilized in the vicinity of $\lambda_0$. The preset temperature for temperature control is $T_0$ for the characteristic line 3-1, $T_{10}$ for the characteristic line 4-1, and $T_{20}$ for the characteristic line 4-2, and the wavelengths at these preset temperatures are $\lambda_0$, $\lambda_{10}$, and $\lambda_{20}$, respectively. The shape of the characteristic line may be regarded as substantially unchanged with time.

When the wavelength of the laser beam emitted from the semiconductor laser varies, the angle of diffraction of the laser beam is also changed. As the angle of diffraction varies, the speed of deflection of the laser beam is also changed. The deflected laser beam is detected successively by the beam position detector and the light detector, and the time difference between the output signals from the beam position detector and the light detector is detected. The time difference varies with the wavelength of the emitted laser beam.

This means that limits can be established for the time difference $\tau$. If the time difference $\tau$ when the laser beam having the wavelength of $\lambda_0 + (\lambda_2 - \lambda_U)$ is scanned is indicated by $\tau_1$, this time difference $\tau_1$ serves, like the limit $Y_1$, as a mark for detecting the step portion on the higher temperature side of the shelf portion B. The mark $\tau_1$ is one example of a limit. As the laser beam wavelength becomes longer, the angle of diffraction of the laser beam becomes larger, and so does the speed of deflection of the laser beam. Therefore, when the wavelength is longer than $\lambda_0 + (\lambda_2 - \lambda_U)$, the time difference $\tau$ is smaller than $\tau$hd 1. Thus, the temperature when $\tau < \tau_1$ is indicated by $T_B$, and it is necessary to set the preset temperature for temperature control to $T_B - \Delta T$ when the condition of $\tau < \tau_1$ is detected.

The present embodiment will be described below in specific detail. In harmony with the above description, it is assumed that the characteristic line of the semiconductor laser is the line 3-1, the limit for the beam position Y detected by the beam position detector 34 is $Y_1$ (corresponding to the beam position when the laser beam of the wavelength of $\lambda_0 + (\lambda_2 - \lambda_U)$ is scanned), and the limit for the time difference $\tau$ between the output signals from the beam position detector 34 and the light detector 36 is $\tau_1$ (corresponding to the time difference when the laser beam of the wavelength of $\lambda_0 + (\lambda_2 - \lambda_U)$ is scanned). It is also assumed that $\Delta T = \frac{1}{2}(T_U - T_L)$.

Figure 9:
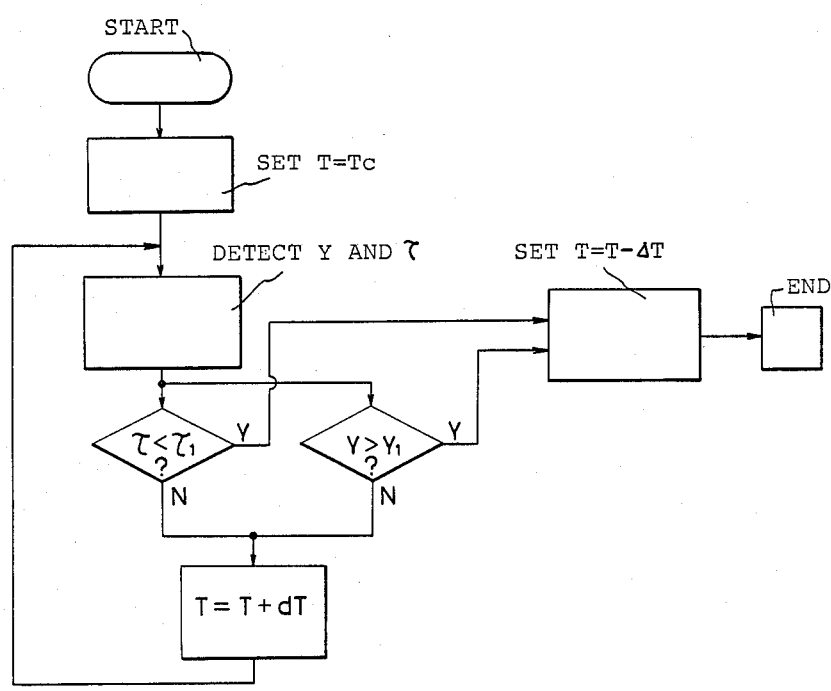

The present embodiment is carried out by the circuit arrangement and the operation sequence shown in FIGS. 8(I) and 9.

When a temperature control process is initiated at the time a main scanning cycle is not effected, the microcomputer 4600 sets the preset temperature in the comparator 4800 to the initial temperature $T_0$. When the temperature of the holder 40 and hence the temperature of the semiconductor laser 10 are controlled to $T_0$, the microcomputer 4600 processes the signals applied by the beam position detector 34 and the light detector 36 to detect the beam position Y and the time difference $\tau$.

The beam position Y and the time difference $\tau$ are compared with the limits $Y_1$, $\tau_1$, respectively. If $Y < Y_1$ and $\tau > \tau_1$, then the microcomputer 4600 increments the preset temperature by a small temperature dT, for example, 0.1 degree. When the temperature of the holder is increased by the above small temperature accordingly, the beam position Y and the time difference $\tau$ are detected again and compared with the limits $Y_1$, $\tau_1$. If $Y > Y_1$ and $\tau > \tau_1$, then the preset temperature is incremented by dT. The above process is repeated until one of the conditions of $Y > Y_1$ and $\tau < \tau_1$ is reached, whereupon a temperature which is T lower than the preset temperature T at that time is set in the comparator 4800, and the temperature control operation is ended. Since the time-dependent change of the characteristic line is detected by the two parameters, i.e., the beam position and the time difference, erroneous operation can be prevented also in this embodiment.

According to the present invention, as described above, there is provided a novel method of controlling the temperature of a semiconductor laser in an optical scanning device. Since the time-dependent change of the characteristic line of the semiconductor laser is taken into account, the method of the invention can stabilize the laser beam wavelength for a long period of time, and can ensure good optical scanning operation for an extended period of time.

The temperature control method of the invention is highly useful for temperature control of a semiconductor laser used as a light source for a holographic scanner. An optical scanning device to which the present invention is applied can serve as an important component in an image writing apparatus or a document reader.

What is claimed is:

1. A method of controlling the temperature of a semiconductor laser, comprising the steps of:
    detecting the temperature of a holder supporting the semiconductor laser with a temperature sensor;

heating or cooling said holder with a Peltier-effect element dependent on an output signal from said temperature sensor to control the temperature of said holder in the vicinity of a preset temperature, for thereby indirectly controlling the temperature of said semiconductor laser;

detecting a deflected laser beam successively with two spaced-apart light detectors disposed outside of a scanning zone of the deflected laser beam each time the laser beam is deflected;

detecting the time difference between output signals from said light detectors related to the detection of the laser beam thereby; and shifting the preset temperature for temperature control by a prescribed temperature and resetting the preset temperature when said time difference falls outside of a predetermined range.

2. A method of controlling the temperature of a semiconductor laser, comprising the steps of:

detecting the temperature of a holder supporting the semiconductor laser with a temperature sensor;

controlling the temperature of said holder in the vicinity of a preset temperature dependent on an output signal from said temperature sensor, for thereby indirectly controlling the temperature of said semiconductor laser;

detecting a deflected laser beam successively with two light detectors disposed outside of a scanning zone of the deflected laser beam;

detecting the time difference between output signals from said light detectors related to detection of the laser beam thereby while varying the temperature of said holder at times when a main scanning cycle is not carried out;

detecting a temperature when said time difference exceeds a prescribed value; and setting as the preset temperature for temperature control a temperature which deviates by a prescribed temperature from said detected temperature.

3. A method of controlling the temperature of a semiconductor laser, comprising the steps of:

detecting the temperature of a holder supporting the semiconductor laser with a temperature sensor;

heating or cooling said holder with a Peltier-effect element dependent on an output signal from said temperature sensor to control the temperature of said holder in the vicinity of a preset temperature, for thereby indirectly controlling the temperature of said semiconductor laser;

detecting a deflected laser beam successively with a beam position detector and a light detector which are disposed outside of a scanning zone of the deflected laser beam;

detecting the position of the deflected laser beam with said beam position detector, and detecting the time difference between output signals from said beam position detector and said light detector related to the detection of the laser beam thereby, at times when a main scanning cycle is not carried out;

shifting the preset temperature for temperature control by a prescribed temperature and resetting the preset temperature when at least one of the beam position and the time difference, as detected, exceeds a limit of a proper range predetermined for each of the beam position and the time difference; and resetting the limits of the proper ranges according to the preset temperature which has been reset.

4. A method of controlling the temperature of a semiconductor laser, comprising the steps of:

detecting the temperature of a holder supporting the semiconductor laser with a temperature sensor;

heating or cooling said holder with a Peltier-effect element dependent on an output signal from said temperature sensor to control the temperature of said holder in the vicinity of a preset temperature, for thereby indirectly controlling the temperature of said semiconductor laser;

detecting a deflected laser beam successively with a beam position detector and a light detector which are disposed outside of a scanning zone of the deflected laser beam;

detecting the position of the deflected laser beam with said beam position detector, and detecting the time difference between output signals from said beam position detector and said light detector related to the detection of the laser beam thereby, while varying the temperature of said holder, at times when a main scanning cycle is not carried out;

detecting the temperature of said holder when at least one of the beam position and the time difference, as detected, exceeds a limit of a proper range predetermined for each of the beam and position and the time difference; and setting, as the preset temperature for temperature control, a temperature which deviates by a prescribed temperature from the detected temperature of said holder.

5. A method as in claim 1, including deriving a synchronizing signal from one of the said light detectors and using said synchronizing signal for synchronizing the main scanning cycles.

6. A method as in claim 1, including resetting the predetermined range of said time difference as a function of the preset temperature which has been reset.

7. A method as in claim 2, including using a Peltier-effect element to control the temperature of said holder.

8. A method as in claim 4, including resetting the predetermined range of said time difference as a function of the preset temperature which has been reset.

9. A method of controlling the temperature of a semiconductor laser, comprising the steps of:

detecting the temperature of a holder supporting the semiconductor laser with a temperature sensor having an output related to the detected temperature;

heating or cooling said holder with a Peltier-effect element dependent on the temperature sensor output to control the temperature of said holder in the vicinity of a preset temperature and thereby indirectly control the temperature of said semiconductor laser;

detecting a deflected laser beam successively with a beam position detector and a light detector which are disposed outside of a scanning zone of the deflected laser beam to thereby detect the position of the beam relative to the beam position detector and the time difference between detection of the beam by the beam position and light detectors;

shifting the preset temperature for temperature control by a prescribed temperature and resetting the preset temperature when at least one of the beam position and the time difference, as detected, exceeds a limit of a proper range predetermined for each of the beam position and the time difference; and resetting the limits of the proper ranges according to the preset temperature which has been reset.

10. A method of controlling the temperature of a semiconductor laser, comprising the steps of:

detecting and comparing the temperature of a holder supporting the semiconductor laser with a preset temperature to control a Peltier-effect element to heat or cool said holder in order to keep the temperature of said holder in the vicinity of the preset temperature and thereby indirectly control the temperature of said semiconductor laser;

detecting a deflected laser beam successively with two light detectors flanking a scanning zone of the deflected laser beam each time the laser beam is deflected;

detecting the time difference between the detection of the beam with said light detectors;

shifting the preset temperature by a prescribed temperature and resetting the preset temperature when said time difference falls outside of a predetermined range; and resetting the limits of the predetermined range of said time difference according to the preset temperature which has been reset.

* * * * *